(12) United States Patent
Kiehlbauch

(10) Patent No.: US 7,553,770 B2
(45) Date of Patent: Jun. 30, 2009

(54) REVERSE MASKING PROFILE IMPROVEMENTS IN HIGH ASPECT RATIO ETCH

(75) Inventor: Mark Kiehlbauch, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 11/758,714

(22) Filed: Jun. 6, 2007

(65) Prior Publication Data

US 2008/0305641 A1    Dec. 11, 2008

(51) Int. Cl.
    *H01L 21/311*    (2006.01)
(52) U.S. Cl. .............. 438/703; 430/313; 430/314; 430/317
(58) Field of Classification Search .............. 438/703
    See application file for complete search history.

(56) References Cited

U.S. PATENT DOCUMENTS

| | | | |
|---|---|---|---|
| 5,330,617 A | | 7/1994 | Haond |
| 6,573,030 B1 * | | 6/2003 | Fairbairn et al. ............ 430/323 |
| 6,852,455 B1 * | | 2/2005 | Lyons et al. .................. 430/5 |
| 6,924,191 B2 * | | 8/2005 | Liu et al. ...................... 438/241 |
| 6,946,385 B2 * | | 9/2005 | Kanamura .................... 438/622 |
| 7,064,078 B2 * | | 6/2006 | Liu et al. ...................... 438/717 |
| 7,079,740 B2 * | | 7/2006 | Vandroux et al. ............ 385/129 |
| 7,151,040 B2 | | 12/2006 | Tran et al. |
| 7,220,683 B2 * | | 5/2007 | Yin et al. ...................... 438/780 |
| 7,341,957 B2 * | | 3/2008 | Sandhu et al. ............... 438/717 |
| 7,407,893 B2 * | | 8/2008 | Seamons et al. ............. 438/778 |
| 2001/0002331 A1 * | | 5/2001 | Miyata ......................... 438/618 |
| 2002/0001778 A1 * | | 1/2002 | Latchford et al. ............ 430/313 |
| 2002/0086547 A1 * | | 7/2002 | Mui et al. ..................... 438/710 |
| 2004/0061227 A1 * | | 4/2004 | Gao et al. ..................... 257/750 |

(Continued)

FOREIGN PATENT DOCUMENTS

| | | |
|---|---|---|
| DE | 25 35 156 A1 | 2/1977 |
| EP | 0 487 380 A1 | 5/1992 |
| EP | 0 928 019 A2 | 7/1999 |
| WO | 02/059951 A1 | 8/2002 |

OTHER PUBLICATIONS

International Search Report and Written Opinion for International application No. PCT/US2008/064295 dated Jul. 14, 2008.

(Continued)

*Primary Examiner*—N Drew Richards
*Assistant Examiner*—Ankush k Singal
(74) *Attorney, Agent, or Firm*—Dinsmore & Shohl LLP

(57) ABSTRACT

A method of improving high aspect ratio etching by reverse masking to provide a more uniform mask height between the array and periphery is presented. A layer of amorphous carbon is deposited over a substrate. An inorganic hard mask is deposited on the amorphous carbon followed by a layer of photodefinable material which is deposited over the array portion of the substrate. The photodefinable material is removed along with the inorganic hard mask overlaying the periphery. A portion of the amorphous carbon layer is etched in the exposed periphery. The inorganic hard mask is removed and normal high aspect ratio etching continues. The amount of amorphous carbon layer remaining in the periphery results in a more uniform mask height between the array and periphery at the end of high aspect ratio etching. The more uniform mask height mitigates twisting at the edge of the array.

20 Claims, 5 Drawing Sheets

A

B

C

U.S. PATENT DOCUMENTS

2004/0079726 A1* 4/2004 Tabery et al. .................. 216/58
2005/0186802 A1 8/2005 Busch et al.
2005/0245075 A1* 11/2005 Arita et al. ................... 438/638
2005/0255702 A1 11/2005 Honeycutt et al.
2006/0231524 A1* 10/2006 Liu et al. ....................... 216/41
2007/0111467 A1* 5/2007 Kim ............................ 438/424
2007/0148984 A1* 6/2007 Abatchev et al. ............ 438/725

OTHER PUBLICATIONS

Stanley Wolf, Ph.D., 15.4 Introduction to Dual-Damascene Interconnect Processes; Excerpt from: Silicon Processing For The VLSI ERA—vol. 4, p. 674-679.

* cited by examiner

A

B

C

REVERSE MASKING PROFILE IMPROVEMENTS IN HIGH ASPECT RATIO ETCH

BACKGROUND OF THE INVENTION

The present invention generally relates to improvements in high aspect ratio etching and, in particular, relates to reverse masking profiling to provide a more uniform mask height between the array and periphery portions of a memory cell to mitigate twisting during high aspect ratio etching.

Today's semiconductor-based integrated circuits and micro-electro-mechanical systems (MEMS) are pushing the limits of many deep etch processes with their need for increasingly deeper and narrower contacts that have aspect ratios greater than 40:1. High aspect ratio (HAR) etching could be key in the future development of devices with high device/feature densities on a semiconductor wafer such as, for example, dynamic random access memory (DRAM) container capacitors and FLASH contacts.

However, as the aspect ratio of the plasma etch increases, twisting is increasingly becoming an issue. "Twisting" is the lateral offset of the bottom of an etched feature from the top. In a cross section, the twisted features bends in the X or Y direction, i.e., to the left and right of the page (X-direction) or in and out of the page (Y-direction). During plasma etching, as the aspect ratio increases, twisting becomes more common. The twisting is caused by asymmetric feature charging, which results in a lateral electrical field. In general, feature charging is due to the electrons having an isotropic velocity distribution, i.e., the thermal velocity is larger than the directed velocity, while the ions have an anisotropic velocity distribution, i.e., the directed velocity is much larger than the thermal velocity. For ions, the directed velocity is normal to the wafer, due to their acceleration by the plasma sheath. This means that most of the electrons will deposit their charge near the top of an HAR feature while the ions deposit their charge more toward the bottom. This results in the top of the feature charging negatively and the bottom positively. If this vertical charging becomes azimuthally asymmetric than the lateral electric field results, causing twisting. Asymmetric charging is caused by asymmetric mask geometry, which results in different view angles for electron and ion fluxes at different locations around the circumference of the contact or container. Differential electric charge builds up on the mask, causing local distortion of the ion trajectory at the edge of the array. This is often stochastic in the array, due to small variation in polymer deposition or lithographic induced asymmetries. At the edge of the array, systematic twisting is frequently observed, wherein the last several (up to 40) features twist in the direction of the edge of the array. One common, and problematic, example of twisting is in a DRAM container oxide etches. During oxide etching, twisting can result in "open" capacitors when the DRAM container does not land on the contact. Alternatively, twisting can cause shorts (doublebits) when two containers twist together.

Theory and computer simulation have shown that the twisting at the edge of the array is caused by different hard mask heights between the periphery and array portions of the semiconductor wafer. As described below, the different mask heights are caused by the faceting of the hard mask. The different mask heights result in a lateral electric field toward the periphery. This electric field pushes ions in the same direction. It is believed that this causes, or at least contributes, to the systematic twisting seen toward the moat at the edge of the array. In other words, for plasma etching with a strong ion energy component, i.e., the etch is as much or more physically driven than it is chemically driven, facets naturally develop because the peak angular yield of incident ions occurs at off-normal incidence. Typically, this is about 60 degrees.

Oxide etch chemistries are typically done at high bias and the dominant ion is argon (Ar+). This means that the oxide etch ions are, in fact, quite physically driven, and prone to faceting.

In the array, the facets "come together" due to the small critical dimension of the space (the "line") between the dynamic random access memory (DRAM) containers. In doing so, the etch rate of the mask in the array is naturally increased as compared to etch rate of the open, peripheral areas due to these geometric considerations. In addition, the difference in open area (i.e., the area to be etched) in the array versus the open area in the periphery contributes to a loading difference that tends to increase the mask loss in the array as compared to periphery. These two effects together result in less mask remaining in the array portion of the semiconductor wafer than in the periphery portion toward the end of a high aspect ratio etch. It is at the time that the systematic twisting typically occurs.

Therefore, it is important to reduce the relative height differential between array and periphery, which results in a lateral electric field and, therefore twisting. This could be done by reducing the faceting of the mask during high-aspect-ratio etches. However, the problem is overconstrained and the high bias and chemistries needed to drive an oxide etch at high aspect ratios results in a fairly fixed level of mask faceting and, therefore, result in a difference in mask height between the periphery and the array.

Therefore, there is a need to provide a solution to the problem of twisting at the edge of an array portion of a semiconductor wafer during high aspect ratio etching by reducing the difference in mask heights between the periphery and the array.

BRIEF DESCRIPTION OF THE SEVERAL VIEWS OF THE DRAWINGS

The following detailed description of specific embodiments of the present invention can be best understood when read in conjunction with the following drawings, where like structure is indicated with like reference numerals and in which.

DETAILED DESCRIPTION

In the following detailed description of the embodiments, reference is made to the accompanying drawings that form a part hereof, and in which are shown by way of illustration, and not by way of limitation, specific embodiments in which the invention may be practiced. It is to be understood that other embodiments may be utilized and that logical, mechanical and electrical changes may be made without departing from the spirit and scope of the present invention.

The term 'substrate' is to be understood as a semiconductor-based material including silicon, silicon-on-insulator (SOI) or silicon-on-sapphire (SOS) technology, doped and undoped semiconductors, epitaxial layers of silicon supported by a base semiconductor foundation, and other semiconductor structures. Further, in the discussion and claims herein, the term 'on' used with respect to two layers, one 'on' the other, means at least some contact between the layers, while 'over' means the layers are in close proximity, but possibly with one or more additional intervening layers such that contact is possible but not required. Neither 'on' nor 'over' implies any directionality as used herein.

Figure 1:
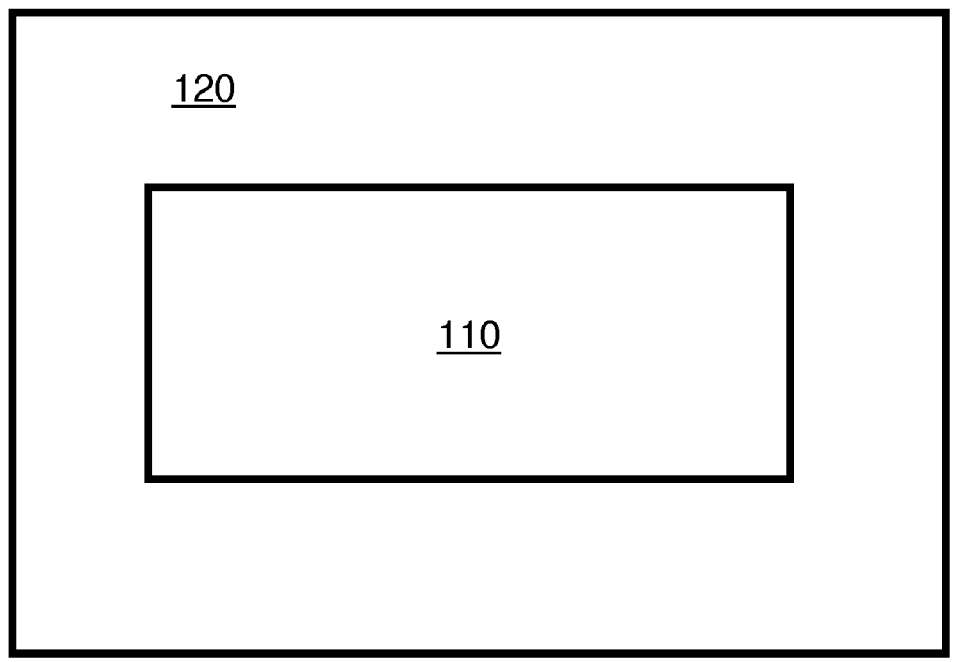
FIG. 1 is a schematic top plan view of a memory device according to an embodiment of the present invention.

Referring initially to FIG. 1, a top view of an integrated circuit 100 such as, for example, a memory cell is illustrated. A central region 110 of the integrated circuit 100, the "array," is surrounded by a peripheral region 120, the "periphery." The array 110 is typically densely populated with conducting lines and electrical devices such as, for example, transistors and capacitors. The periphery 120 typically is comprised of features larger than those found in the array 110. Consequentially, typically, high aspect ratio etching is performed in the array 110, whereas low aspect ratio is performed in the periphery 120. Alternatively, the periphery 120 may contain no features for a given masking level.

Figure 2:
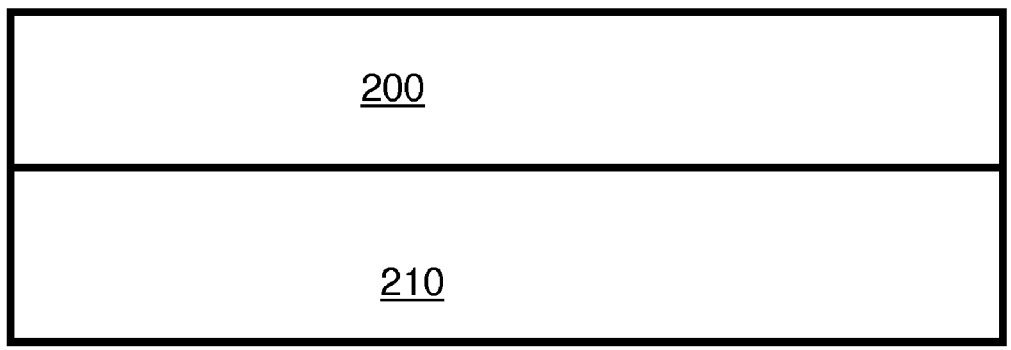
FIGS. 2-6 are schematic cross-sectional views of the formation of a masking level according to an embodiment of the present invention.
Figure 3:
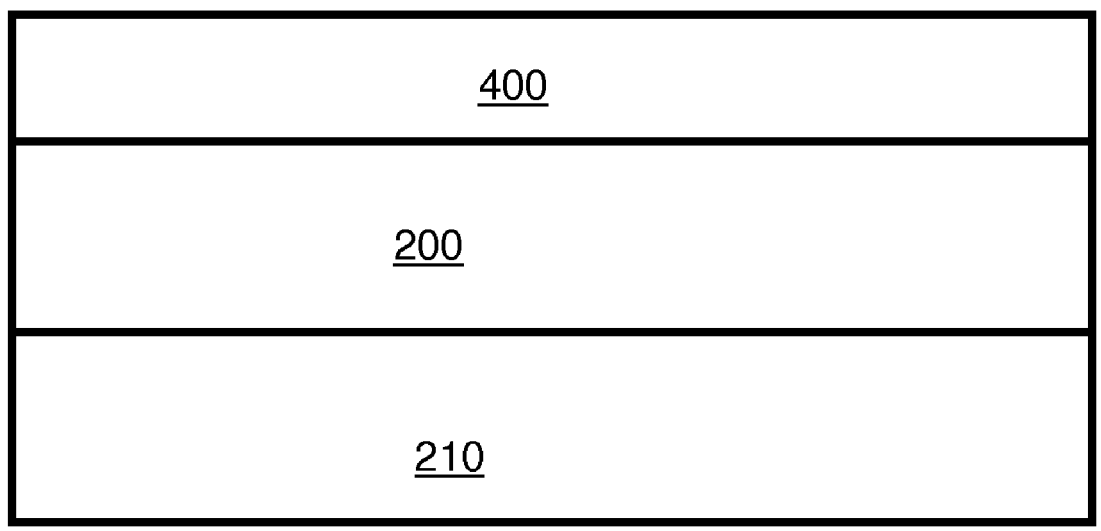
Figure 4:
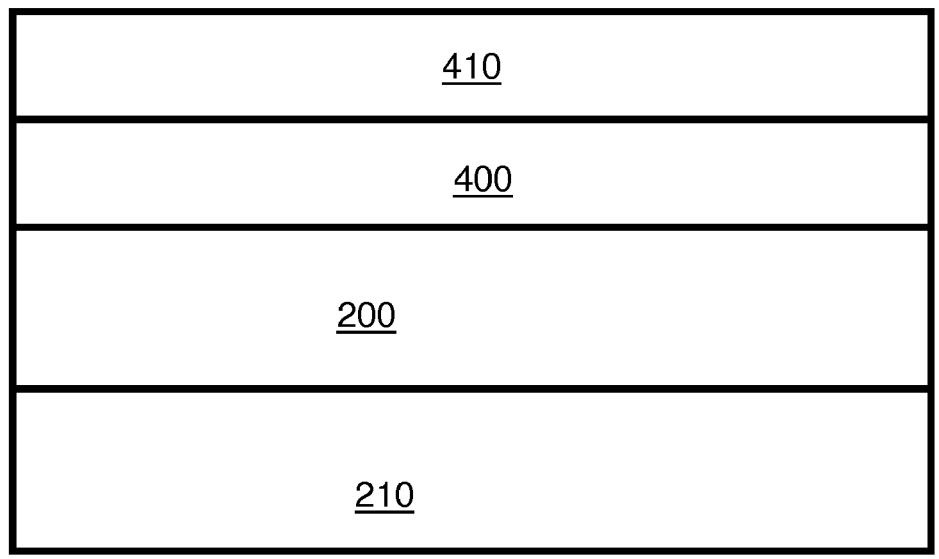
Figure 5:
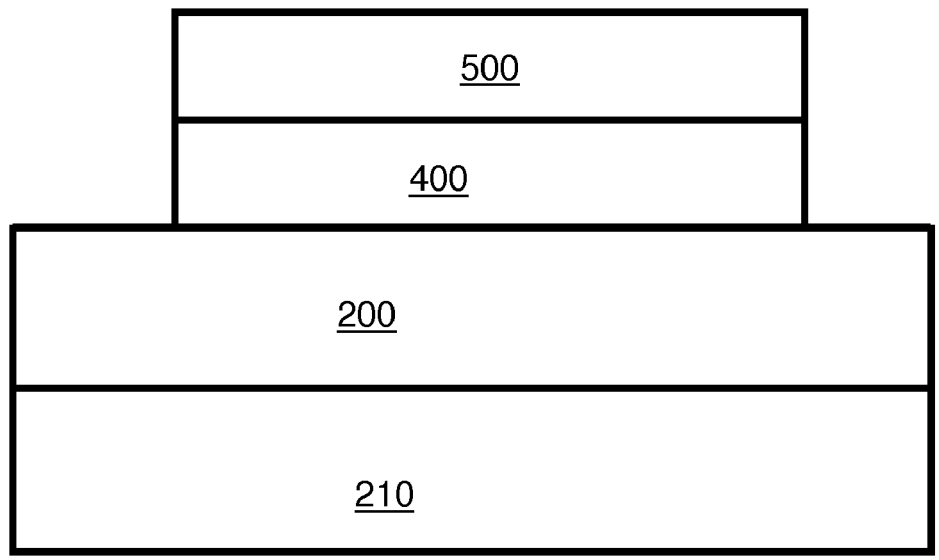

Referring to FIG. 2, a layer of amorphous carbon 200 is deposited over a substrate 210. Typically, the amorphous carbon layer 200 can have a thickness of about 4000 Å to about 10000 Å. As shown in FIG. 3, a hard mask layer 400 is then deposited over the amorphous carbon layer 200. This hard mask layer can be an inorganic material such as, for example, silicon oxynitride anti-reflective coating (SiON ARC). This hard mask layer 400 typically have a thickness of between about 200 Å to about 500 Å. Typical photolithography can then be performed where a bottom anti-reflective coating (BARC) (not shown) can be deposited over the SiON ARC layer 400 to control light reflections. As shown in FIG. 4, a photodefinable material layer 410 is deposited on the BARC and SiON ARC 400 layers. The photodefinable material 410 typically can have a thickness of between 500 Å to about 1500 Å. The photodefinable material 410 can be photoresist material or any other suitable photodefinable material known in the art. The array 110 is then patterned with, for example, contacts and containers. The photodefinable material layer 410 can then be exposed and developed. The BARC layer can be consumed, leaving the SiON ARC layer 400 over the amorphous carbon layer 200. Photolithography is again performed leaving another layer of photodefinable material layer 500 over the array and exposing the periphery 120. The SiON ARC layer 400 can be then etched away from the periphery 120 portion as shown in FIG. 5.

Figure 6:
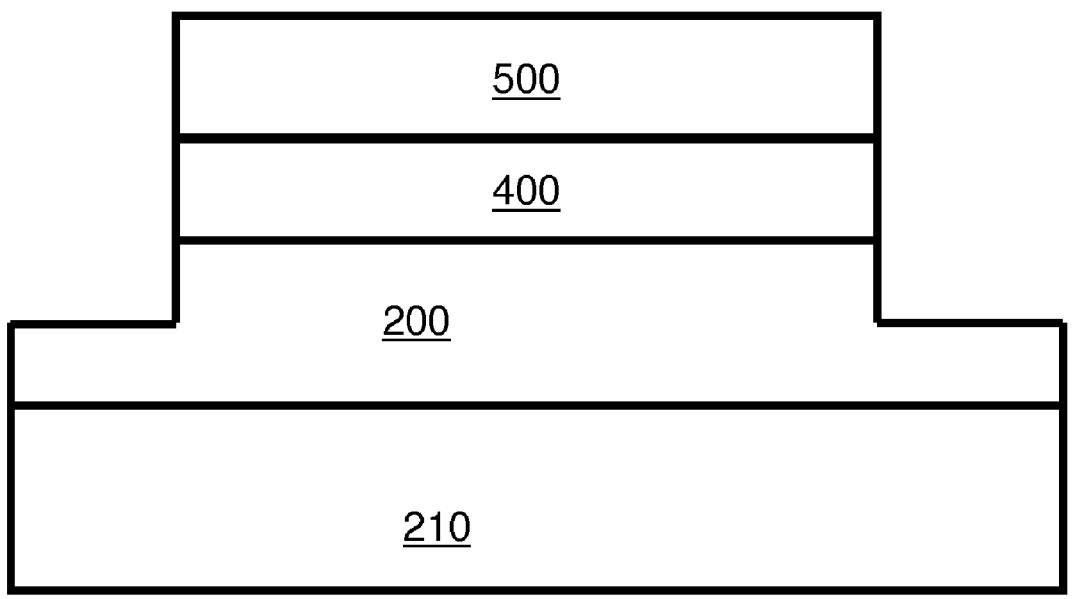

As shown in FIG. 6, a portion of the amorphous carbon layer 200 can then be etched away in the exposed periphery 120 portion resulting in a thicker layer of amorphous carbon 200 in the array 110 portion than the periphery 120. Typically, approximately half of the thickness of the layer of amorphous carbon 200 is etched away in the periphery 120 portion. For example, if the original amount of amorphous carbon deposited over the substrate 210 is 8000 Å, approximately 4000 Å would be etched away in the periphery 120 portion. The photodefinable material layer 500 can have a thickness that is approximately equal to the amount of amorphous carbon etched from the periphery 120. This photodefinable material thickness is due to the fact that the photodefinable material layer 500 etches at least as fast as the amorphous carbon 200. For example, if approximately 4000 Å amorphous carbon is to be etched, the photodefinable material layer 500 can have a thickness of approximately 4000 Å.

A portion of the amorphous carbon layer 200 remains over the periphery 120 after etching. The amount of the amorphous carbon layer 200 remaining is adjusted depending on the consumption of the amorphous carbon layer 200 during the HAR etch such that the heights of the array 110 and the periphery 120 matched toward the end of the HAR plasma etch. The photodefinable material layer 500 is exposed and developed away through exposure to light at the appropriate wavelength.

Typical HAR plasma etch can then be performed. The SiON layer 400 remaining over the amorphous carbon layer 200 in the array 110 will be consumed during the HAR plasma etch resulting in the layer of amorphous carbon 200 of variable thickness covering entire surface of the substrate 210. However, by the end of the HAR plasma etch, the amorphous carbon layer 200 will have approximately the same thickness over the entire surface of the substrate 210. Alternatively, a fill material may be used over the layer of amorphous carbon 200 in the periphery 120 before the start of the HAR plasma etch in order to reduce any topography issues caused by the varying thickness of the amorphous carbon layer 200. It will be appreciated that the layers described above can be formed by various methods known in the art. For example, chemical vapor deposition can be used to form the hard mask layers, spin-on-coating processes can be used to form the photodefinable material layers, and the amorphous carbon layer 200 can be formed by chemical vapor deposition using a hydrocarbon compound, or mixtures of such compounds, as carbon precursors.

At the start of the high aspect ratio plasma oxide etch, the layer of amorphous carbon 200 will be thicker over the array 110 portion of the substrate 210 than over the periphery 120 portion. However, this thinner amount of amorphous carbon 200 in the periphery 120 does not cause issues due to the fact the amorphous carbon 200 etch rate in the periphery 120 portion, as mentioned above, is lower than in the array 110 portion. At the end of the high aspect ratio plasma oxide etch, the mask heights in the periphery 120 and the array 110 portions should be similar. In other words, the amount of the amorphous carbon layer 200 remaining over the periphery 120 portion results in a more uniform mask height between the array 110 and periphery 120 portions at the end of high aspect ratio plasma oxide etching. This more uniform mask height across the memory device reduces the lateral charging difference and, therefore, mitigates twisting toward the moat at the edge of the array 110 portion.

Figure 7:
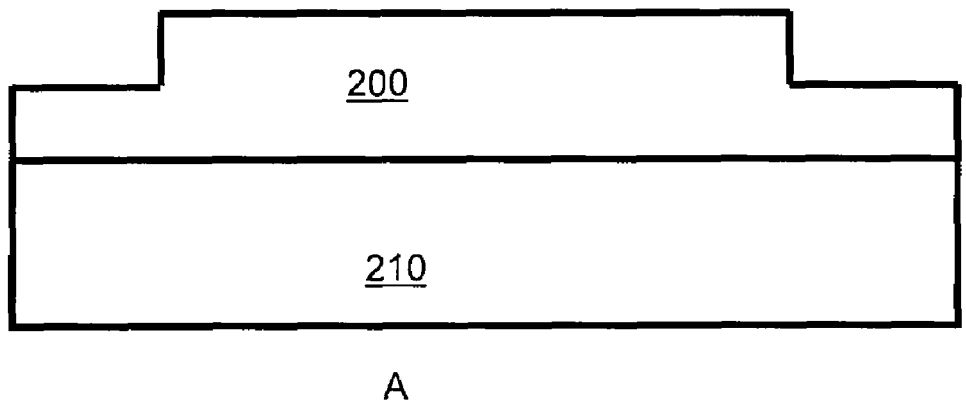
FIGS. 7A-C are schematic cross-sectional views of the formation of a masking level according to another embodiment of the present invention.
Figure 7:
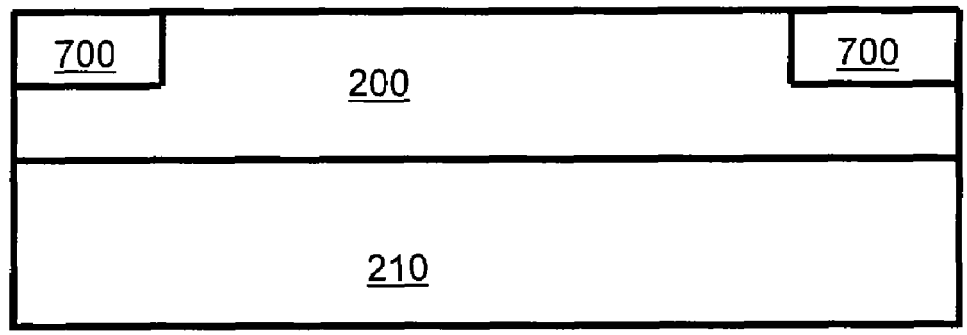
Figure 7:
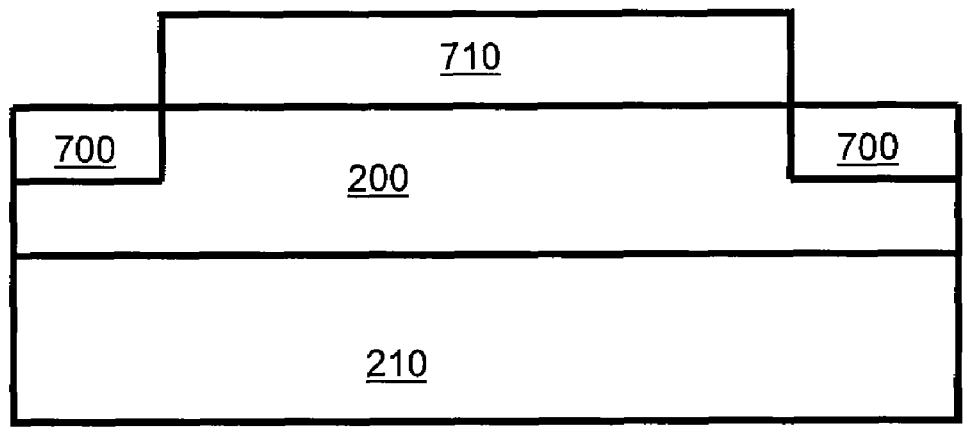

Alternatively, both the BARC layer and the SiON ARC layer 400 can be etched after the array 110 has been patterned, leaving only the layer of amorphous carbon 200 over the substrate 210. In this embodiment, after a portion of the amorphous carbon layer 200 is etched away in the periphery 120 as seen in FIG. 7A, another photodefinable material layer/photolithography process step can occur which exposes the amorphous carbon layer 200 in the array portion 110 while leaving a layer of photodefinable material 700 over the amorphous carbon 200 in the periphery portion 120 as illustrated in FIG. 7B. Another layer of inorganic material 710 such as, for example, SiON ARC, can then be used as a hard mask 710 to etch the amorphous carbon 200 in the array 110 while the photodefinable material layer 700 protects the periphery 120 from further etching as illustrated in FIG. 7C. Normal HAR plasma etch can then occur. The amount of amorphous carbon 200 and photodefinable material 710 over the periphery 120 can be adjusted to equalize the mask height of the material in the array 110 and the periphery 120 after the end of the HAR etch. Again, it will be appreciated that the layers described above can be formed by various methods known in the art. For example, chemical vapor deposition can be used to form the hard mask layers, spin-on-coating processes can be used to form the photodefinable material layers, and the amorphous carbon layer 200 can be formed by chemical vapor deposition using a hydrocarbon compound, or mixtures of such compounds, as carbon precursors.

It is noted that terms like "preferably," "commonly," and "typically" are not utilized herein to limit the scope of the claimed invention or to imply that certain features are critical, essential, or even important to the structure or function of the claimed invention. Rather, these terms are merely intended to highlight alternative or additional features that may or may not be utilized in a particular embodiment of the present invention.

Having described the invention in detail and by reference to specific embodiments thereof, it will be apparent that modifications and variations are possible without departing from the scope of the invention defined in the appended claims. More specifically, although some aspects of the present invention are identified herein as preferred or particularly advantageous, it is contemplated that the present invention is not necessarily limited to these preferred aspects of the invention.

What is claimed is:

1. A method of fabricating a memory device, the method comprising:
    depositing a layer of amorphous carbon over a substrate, wherein the substrate comprises an array portion surrounded by a periphery portion;
    depositing an inorganic hard mask over the layer of amorphous carbon;
    depositing a layer of photodefinable material on the inorganic hard mask over the array portion of the substrate;
    removing the photodefinable material and the portion of the inorganic hard mask located over the periphery portion of the substrate;
    removing a portion of the amorphous carbon layer in the exposed periphery of the substrate;
    removing the inorganic hard mask resulting in a thicker layer of amorphous carbon over the array portion than the periphery portion;
    depositing a second inorganic hard mask over the layer of amorphous carbon;
    performing photolithography on the memory device; and
    high aspect ratio plasma oxide etching.

2. The method of claim 1, further comprising:
    adjusting the portion of amorphous carbon remaining over the substrate depending on consumption of the amorphous carbon during high aspect ratio etching.

3. The method of claim 1, performing photolithography on the memory device, further comprises:
    depositing a bottom anti-reflective coating on the second inorganic hard mask; and
    depositing a photoresist layer over the bottom anti-reflective coating.

4. The method of claim 1, wherein the portion of the amorphous carbon layer remaining in the periphery results in a more uniform mask height between the array and periphery portions at the end of high aspect ratio plasma etching.

5. The method of claim 1, wherein the portion of the amorphous carbon layer remaining in the periphery is about half the thickness of the amorphous carbon layer in the array.

6. The method of claim 1, wherein the away portion of the substrate is a central portion of the substrate and is more densely populated than the periphery.

7. The method of claim 1, wherein the photodefinable material layer is a photoresist mask.

8. The method of claim 1, wherein the high aspect ratio etching occurs in the array portion of the substrate.

9. The method of claim 1, wherein the layer of the amorphous carbon has a thickness of between about 4000 Å to about 10000 Å.

10. The method of claim 1, wherein the inorganic hard mask has a thickness of between about 200 Å to about 500 Å.

11. The method of claim 1, wherein the photodefinable material has a thickness of between about 500 Å to about 1500 Å.

12. A method of fabricating a memory device, the method comprising:
    depositing a layer of amorphous carbon over a substrate, wherein the substrate comprises an array portion and a periphery portion;
    depositing a first inorganic hard mask over the layer of amorphous carbon;
    depositing a layer of photodefinable material on the first inorganic hard mask over the array portion of the substrate;
    removing the photodefinable material and the portion of the first inorganic hard mask located over the periphery portion of the substrate;
    removing the first inorganic hard mask resulting in a thicker layer of amorphous carbon over the array than the periphery; and
    depositing a second inorganic hard mask over the layer of amorphous carbon;
    performing photolithography; and
    high aspect ratio etching.

13. The method of claim 12, wherein the first and second inorganic hard masks comprise an anti-reflective coating of silicon oxynitride.

14. The method of claim 12, performing photolithography further comprises:
    depositing a bottom anti-reflective coating on the second inorganic hard mask; and
    depositing a photoresist layer over the bottom anti-reflective coating.

15. The method of claim 12, further comprising:
    adjusting the portion of amorphous carbon depending on consumption of the amorphous carbon during high aspect ratio etching.

16. The method of claim 12, wherein the amorphous carbon mask level results in a mask height that is the same height in the array as in the periphery at the end of the high aspect ratio etch.

17. The method of claim 12, wherein the periphery portion surrounds the array portion.

18. A method of improving high aspect ratio etching by reverse masking profiling to provide a more uniform mask height between the array and periphery of a memory device, the method comprising:
    depositing a layer of amorphous carbon over a substrate, wherein the substrate comprises an array portion and a periphery portion;
    depositing an inorganic hard mask over the layer of amorphous carbon;
    depositing a layer of photodefinable material on the inorganic hard mask over the array portion of the substrate;
    removing the photodefinable material and the portion of the inorganic hard mask located over the periphery portion of the substrate;
    removing the inorganic hard mask resulting in a thicker layer of amorphous carbon over the array than the periphery;
    depositing a second inorganic hard mask over the layer of amorphous carbon; performing photolithography on the memory device;
    high aspect ratio plasma oxide etching; and
    adjusting the portion of amorphous carbon removed depending on consumption of the amorphous carbon during high aspect ratio plasma oxide etching.

19. The method of claim 18, wherein the amorphous carbon mask level results in the more uniform mask height at the end of the high aspect ratio etching.

20. The method of claim 18, further comprising:
    depositing a fill material over the portion of the amorphous carbon layer remaining in the periphery after the removal of the inorganic hard mask.

* * * * *

UNITED STATES PATENT AND TRADEMARK OFFICE
CERTIFICATE OF CORRECTION

| | | |
|---|---|---|
| PATENT NO. | : 7,553,770 B2 | Page 1 of 1 |
| APPLICATION NO. | : 11/758714 | |
| DATED | : June 30, 2009 | |
| INVENTOR(S) | : Mark Kiehlbauch | |

It is certified that error appears in the above-identified patent and that said Letters Patent is hereby corrected as shown below:

In column 5, line 47, in Claim 6, delete "away" and insert -- array --, therefor.

Signed and Sealed this

Twenty-fifth Day of August, 2009

David J. Kappos
*Director of the United States Patent and Trademark Office*